US012805160B2

(12) United States Patent
Lee et al.

(10) Patent No.: US 12,805,160 B2
(45) Date of Patent: Nov. 17, 2026

(54) DISPLAY APPARATUS

(71) Applicant: LG Display Co., Ltd., Seoul (KR)

(72) Inventors: Dayeong Lee, Paju-si (KR); Kyuhan Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 372 days.

(21) Appl. No.: 18/750,276

(22) Filed: Jun. 21, 2024

(65) Prior Publication Data

US 2025/0221254 A1 Jul. 3, 2025

(30) Foreign Application Priority Data

Dec. 29, 2023 (KR) ........................ 10-2023-0196486

(51) Int. Cl.
*H10K 59/80* (2023.01)
*H10K 59/122* (2023.01)
*H10K 59/123* (2023.01)
*H10K 59/124* (2023.01)
*H10K 59/40* (2023.01)

(52) U.S. Cl.
CPC ......... *H10K 59/873* (2023.02); *H10K 59/122* (2023.02); *H10K 59/40* (2023.02); *H10K 59/8731* (2023.02); *H10K 59/123* (2023.02); *H10K 59/124* (2023.02)

(58) Field of Classification Search
CPC .. H10K 59/873; H10K 59/122; H10K 59/123; H10K 59/124; H10K 59/40; H10K 59/8731; H10K 50/844; H10K 50/80; H10K 59/80
See application file for complete search history.

(56) References Cited

U.S. PATENT DOCUMENTS

| | | | | |
|---|---|---|---|---|
| 12,349,553 B2 * | 7/2025 | Lee | ...................... | H10K 59/122 |
| 2017/0148856 A1 * | 5/2017 | Choi | .................... | H10K 59/124 |
| 2022/0102678 A1 * | 3/2022 | Kim | ....................... | H10K 50/11 |
| 2022/0246701 A1 * | 8/2022 | Lee | ...................... | H10K 59/122 |
| 2023/0169913 A1 * | 6/2023 | Ryoo | ....................... | G09G 3/32 |
| 2024/0206288 A1 * | 6/2024 | Kim | ................... | H10K 59/1201 |
| 2024/0224723 A1 * | 7/2024 | An | .......................... | C09D 1/00 |

(Continued)

FOREIGN PATENT DOCUMENTS

| | | | | |
|---|---|---|---|---|
| DE | 102021132347 A1 * | 6/2022 | ........... | G06F 3/0445 |
| EP | 3291325 B1 * | 8/2021 | ............ | H10P 74/273 |

(Continued)

*Primary Examiner* — Earl N Taylor
(74) *Attorney, Agent, or Firm* — Seed Intellectual Property Law Group LLP

(57) ABSTRACT

A display apparatus includes a metal layer on a substrate in a display area and a part of a non-display area. The display apparatus includes an electrode disposed on the metal layer. The display apparatus includes an encapsulation layer disposed on the electrode, sealing a top and a side of the electrode and comprising an organic layer. The display apparatus includes a first dam disposed on the substrate in the non-display area, and surrounding a perimeter of the organic layer of the encapsulation layer. The display apparatus includes a first control part disposed on the substrate between the first dam and the display area and spaced apart from the first dam, surrounding at least a part of the display area, and formed to protrude on or be recessed into at least one of the electrode and the metal layer.

26 Claims, 10 Drawing Sheets

(56) References Cited

U.S. PATENT DOCUMENTS

| | | | | |
|---|---|---|---|---|
| 2024/0357875 | A1 * | 10/2024 | Jeon | H10K 59/873 |
| 2025/0268073 | A1 * | 8/2025 | Ha | H10K 59/122 |
| 2025/0280708 | A1 * | 9/2025 | Ahn | H10K 59/131 |

FOREIGN PATENT DOCUMENTS

| | | | | |
|---|---|---|---|---|
| KR | 20190030951 | A * | 3/2019 | H01L 51/5237 |
| KR | 20190075553 | A * | 7/2019 | H01L 27/3211 |
| KR | 20190081061 | A * | 7/2019 | H01L 51/5268 |
| KR | 102399950 | B1 * | 5/2022 | H10K 59/124 |

* cited by examiner

DISPLAY APPARATUS

CROSS-REFERENCE TO RELATED APPLICATION

This application claims priority from Korean Patent Application No. 10-2023-0196486 filed on Dec. 29, 2023, which is hereby incorporated by reference for all purposes as if fully set forth herein.

BACKGROUND

Technical Field

Embodiments of the present disclosure relate to a display apparatus.

Description of the Related Art

In general, a display apparatus is mounted on an electronic product or a home appliance, such as a television, a monitor, a notebook computer, a smartphone, a tablet computer, an electronic pad, a wearable device, a watch phone, a portable information device, a navigation or a vehicle control display, to be used as a screen for displaying an image.

Since an organic light emitting element applied to a display apparatus is vulnerable to moisture, oxygen, etc., an encapsulation layer is formed by alternately applying an organic layer and an inorganic layer. For example, the organic layer which forms the encapsulation layer may be formed by applying a liquid organic material on a substrate through an inkjet device and then performing a curing process.

BRIEF SUMMARY

The inventors of the present disclosure have appreciated that due to the characteristics of the organic material with fluidity, various problems may arise in that, when forming the organic layer using the inkjet device, it is difficult to control the organic layer into a desired shape. Further, due to the presence of irregular steps of an underlying layer, the length and shape of each end of the encapsulation layer are likely to become different. In addition, since the organic layer has fluidity till the curing process, a technical problem may arise in that the liquid organic material constituting the organic layer invades an area where a driving circuit is formed on the outer part of a substrate, to cause a driving failure.

Various embodiments of the present disclosure address one or more technical problems in the related art, including the technical problem identified above.

Embodiments of the present disclosure are directed to providing a display apparatus in which when an organic material is injected using an inkjet device, the organic material does not flow toward a dam at once so that it is possible to form an encapsulation layer into a desired shape.

Embodiments of the present disclosure are directed to providing a display apparatus in which the flow of an organic material in a non-display area is consistently guided so that the end of an encapsulation layer is formed at a desired location after curing.

Embodiments of the present disclosure are directed to providing a display apparatus which is capable of solving a problem that an organic material invades a driving circuit located outside a dam to cause a driving failure.

According to an embodiment of the present disclosure, a display apparatus may include: a base substrate including a display area and a non-display area which surrounds the display area; a metal layer formed on the base substrate in the display area and a part of the non-display area; an electrode disposed on the metal layer; an encapsulation layer disposed on the electrode, sealing a top and a side of the electrode and comprising an organic layer; a first dam disposed on the base substrate in the non-display area, and surrounding a perimeter of the organic layer of the encapsulation layer; and a first control part disposed on the base substrate between the first dam and the display area and spaced apart from the first dam, surrounding at least a part of the display area, and formed to protrude on or be recessed into at least one of the electrode and the metal layer.

According to the embodiments of the present disclosure, by forming a control part for controlling the flow speed of the organic material between a display area and a dam, since, when the organic material is injected using an inkjet device, the organic material does not flow toward the dam at once, it is possible to provide a display apparatus in which the encapsulation layer may be formed into a desired shape.

According to the embodiments of the present disclosure, by forming, in a non-display area, guide portions for guiding the flow of an organic material, it is possible to consistently flow the organic material in one direction. Accordingly, even though there is an irregular step in an underlying layer, by consistently guiding the flow of the organic material through the guide portions, it is possible to provide a display apparatus in which the end of an encapsulation layer is formed at a desired location after curing.

According to the embodiments of the present disclosure, by preventing, by the control part, the organic material from overflowing out of the dam, it is possible to solve a problem that the organic material invades a driving circuit located outside the dam to cause a driving failure.

According to the embodiments of the present disclosure, by forming the control part with the same material as a bank, it is possible to provide a display apparatus capable of implementing a uni-material product in which the materials of components are simplified and unified.

DETAILED DESCRIPTION

Figure 1:
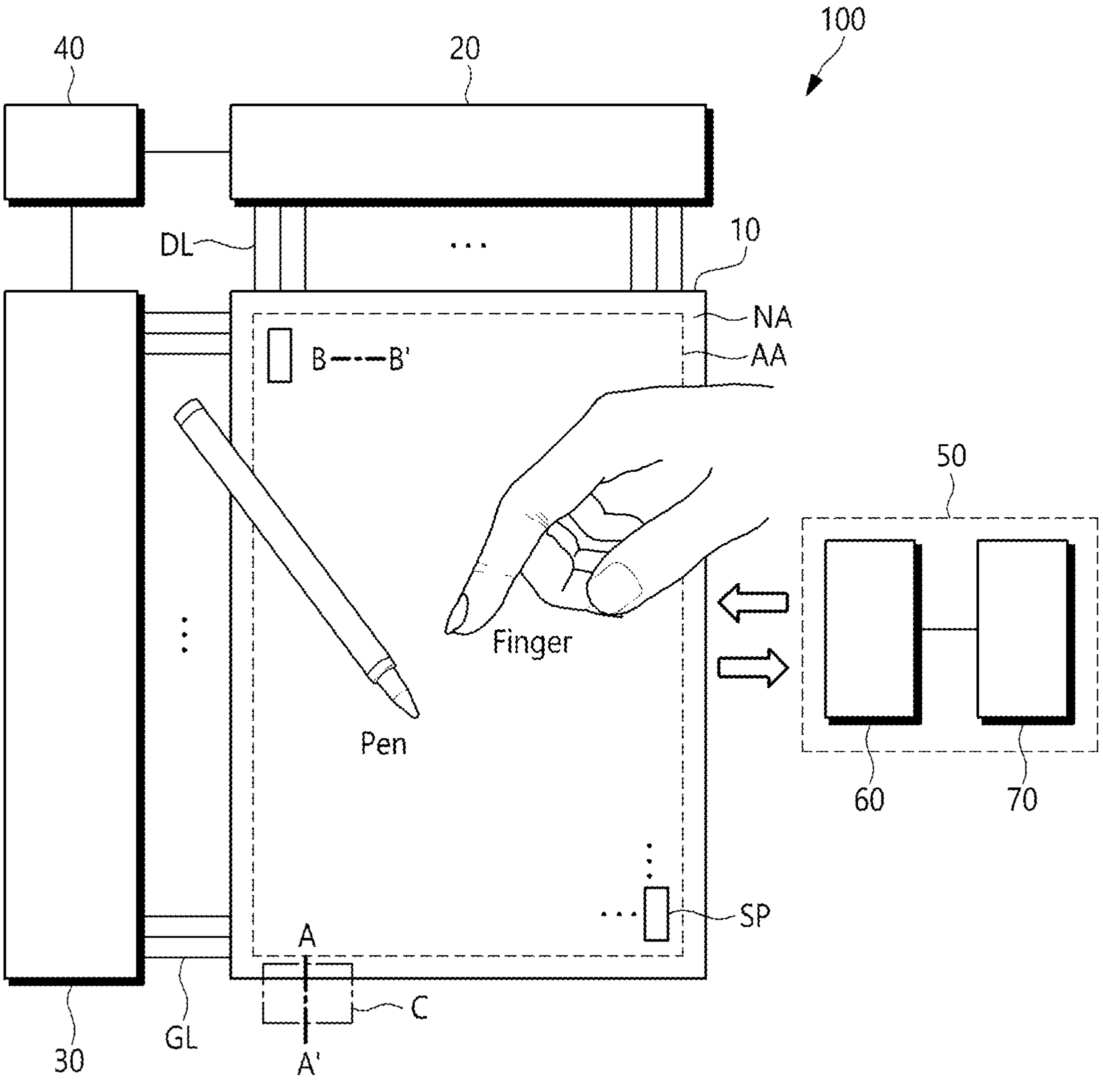
FIG. 1 is a system configuration diagram of a display apparatus according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "make up of" and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)" or "(B)" may be used herein to describe elements of the present disclosure. Each of these terms is not used to define essence, order, sequence, number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before" and the like, are used to describe processes or operations of elements or configurations, or flows or steps in operating, processing, manufacturing methods, these terms may be used to describe non-consecutive or non-sequential processes or operations unless the term "directly" or "immediately" is used together.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

In addition, when any dimensions, relative sizes, etc., are mentioned, it should be considered that numerical values for elements or features, or corresponding information (e.g., level, range, etc.) include a tolerance or error range (e.g., ±10%) that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to the accompanying drawings.

FIG. 1 is a system configuration diagram of a display apparatus in accordance with an embodiment of the present disclosure.

Referring to FIG. 1, a display apparatus 100 may include, as components for displaying an image, a display panel 10 and a display driving circuit for driving the display panel 10.

The display driving circuit may include a data driving circuit 20, a gate driving circuit 30 and a display controller 40.

The display panel 10 may include a display area AA in which an image is displayed and a non-display area NA in which an image is not displayed. The non-display area NA may be an area outside the display area AA, and may also be referred to as a bezel area. The entirety or a part of the non-display area NA may be an area which is visible on the front surface of the display apparatus 100 or an area which is bent and is not visible on the front surface of the display apparatus 100.

The display panel 10 may include a plurality of subpixels SP. In order to drive the plurality of subpixels SP, the display panel 10 may further include various types of signal wirings.

The display apparatus 100 according to the embodiment of the present disclosure may be a liquid crystal display apparatus or the like, or may be a self-emissive display apparatus in which the display panel 10 self-emits light. When the display apparatus 100 according to the embodiment of the present disclosure is a self-emissive display apparatus, each of the plurality of subpixels SP may include a light emitting element.

For example, the display apparatus 100 according to the embodiment of the present disclosure may be an organic light emitting display apparatus in which a light emitting element is implemented using an organic light emitting diode (OLED). For another example, the display apparatus 100 according to the embodiment of the present disclosure may be an inorganic light emitting display apparatus in which a light emitting element is implemented using an inorganic-based light emitting diode. For still another example, the display apparatus 100 according to the embodiment of the present disclosure may be a quantum dot display apparatus in which a light emitting element is implemented using quantum dots as semiconductor crystals which self-emit light.

The structure of each of the plurality of subpixels SP may vary depending on the type of the display apparatus 100. For example, when the display apparatus 100 is a self-emissive display apparatus in which each subpixel SP self-emits light, each subpixel SP may include a self-emissive light emitting element, at least one transistor and at least one capacitor.

For example, the various types of signal wirings may include a plurality of data lines DL which transfer data signals (also referred to as data voltages or image signals) and a plurality of gate lines GL which transfer gate signals (also referred to as scan signals).

The plurality of data lines DL and the plurality of gate lines GL may intersect each other. Each of the plurality of data lines DL may be disposed to extend in a first direction. Each of the plurality of gate lines GL may be disposed to extend in a second direction.

The first direction may be a column direction, and the second direction may be a row direction. Alternatively, the first direction may be a row direction, and the second direction may be a column direction.

The data driving circuit 20 as a circuit for driving the plurality of data lines DL may output data signals to the plurality of data lines DL. The gate driving circuit 30 as a circuit for driving the plurality of gate lines GL may output gate signals to the plurality of gate lines GL. The display controller 40 as a device for controlling the data driving circuit 20 and the gate driving circuit 30 may control data driving timing for the plurality of data lines DL and gate driving timing for the plurality of gate lines GL.

The display controller 40 may supply a data driving control signal to the data driving circuit 20 to control the data driving circuit 20, and may supply a gate driving control signal to the gate driving circuit 30 to control the gate driving circuit 30.

The data driving circuit 20 may supply data signals to the plurality of data lines DL according to the data driving timing control of the display controller 40. The data driving circuit 20 may receive image data of a digital type from the display controller 40, may convert the received image data into data signals of an analog type, and may output the data signals to the plurality of data lines DL.

The gate driving circuit 30 may supply gate signals to the plurality of gate lines GL according to the gate driving timing control of the display controller 40. The gate driving circuit 30 may be supplied with a first gate voltage corresponding to a turn-on level voltage and a second gate voltage corresponding to a turn-off level voltage along with various gate driving control signals (e.g., a start signal, a reset signal, etc.), may generate gate signals, and may supply the generated gate signals to the plurality of gate lines GL.

For example, the data driving circuit 20 may be connected to the display panel 10 in a tape automated bonding (TAB) method, may be connected to the bonding pads of the display panel 10 in a chip-on-glass (COG) or chip-on-panel (COP) method, or may be connected to the display panel 10 by being implemented in a chip-on-film (COF) method.

The gate driving circuit 30 may be connected to the display panel 10 in a tape automated bonding (TAB) method, may be connected to the bonding pads of the display panel 10 in a chip-on-glass (COG) or chip-on-panel (COP) method, or may be connected to the display panel 10 according to a chip-on-film (COF) method. Alternatively, the gate driving circuit 30 may be formed in the non-display area NA of the display panel 10 in a gate-in-panel (GIP) type. The gate driving circuit 30 may be disposed on a substrate or may be connected to the substrate. Namely, in the case of the GIP type, the gate driving circuit 30 may be disposed in the non-display area NA of the substrate. In the case of the chip-on-glass (COG) type or the chip-on-film (COF) type, the gate driving circuit 30 may be connected to the substrate.

At least one driving circuit of the data driving circuit 20 and the gate driving circuit 30 may be disposed in the display area AA of the display panel 10. For example, at least one driving circuit of the data driving circuit 20 and the gate driving circuit 30 may be disposed not to overlap the subpixels SP, or may be disposed to partially or entirely overlap the subpixels SP.

The data driving circuit 20 may be connected to one side (e.g., the upper side or the lower side in FIG. 1) of the display panel 10. Depending on a driving method, a panel design method, etc., the data driving circuit 20 may be connected to both sides (e.g., the upper side and the lower side in FIG. 1) of the display panel 10, or may be connected to at least two sides of the four sides of the display panel 10.

The gate driving circuit 30 may be connected to one side (e.g., the left side or the right side in FIG. 1) of the display panel 10. Depending on a driving method, a panel design method, etc., the gate driving circuit 30 may be connected to both sides (e.g., the left side and the right side in FIG. 1) of the display panel 10, or may be connected to at least two sides of the four sides of the display panel 10.

The display controller 40 may be implemented as a component separate from the data driving circuit 20, or may be implemented as an integrated circuit by being integrated with the data driving circuit 20.

The display controller 40 may be a timing controller which is used in general display technology, may be a control device which includes a timing controller and is capable of further performing other control functions, may be a control device which is different from a timing controller, or may be a circuit in a control device. The display controller 40 may be implemented by various circuits or electronic parts such as an integrated circuit (IC), a field programmable gate array (FPGA), an application specific integrated circuit (ASIC) and a processor.

The display controller 40 may be mounted on a printed circuit board, a flexible printed circuit or the like, and may be electrically connected to the data driving circuit 20 and the gate driving circuit 30 through the printed circuit board, the flexible printed circuit or the like.

The display controller 40 may transmit and receive signals to and from the data driving circuit 20 via at least one predetermined interface. For example, the interface may include a low voltage differential signaling (LVDS) interface, an EPI interface, a serial peripheral interface (SPI), etc.

In order to further provide a touch sensing function in addition to an image display function, the display apparatus 100 according to the embodiment of the present disclosure may include a touch panel and a touch sensing circuit 50 which, by sensing the touch panel, detects whether a touch event has occurred by a touch object such as a finger or a pen or detects a touch location.

The touch sensing circuit 50 may include a touch driving circuit 60 which generates and outputs touch sensing data by driving and sensing the touch panel, and a touch controller 70 which is able to detect the occurrence of a touch event or detect a touch location using the touch sensing data.

The touch panel may include a plurality of touch electrodes as a touch sensor. The touch panel may further include a plurality of touch routing wirings for electrically connecting the plurality of touch electrodes and the touch driving circuit 60.

The touch panel may exist outside the display panel 10, or may exist inside the display panel 10. In the case where the touch panel exists outside the display panel 10, the touch panel is referred to as an external type. When the touch panel is the external type, the touch panel and the display panel 10 may be separately manufactured and be coupled during an assembly process. The touch panel of the external type may include a substrate and a plurality of touch electrodes on the substrate. In the case where the touch panel exists inside the display panel 10, the touch panel is referred to as an internal type. When the touch panel is the internal type, the touch panel may be formed in the display panel 10 during the manufacturing process of the display panel 10.

The touch driving circuit 60 may supply a touch driving signal to at least one of the plurality of touch electrodes, and may generate touch sensing data by sensing at least one of the plurality of touch electrodes.

The touch sensing circuit 50 may perform touch sensing in a self-capacitance sensing method or a mutual-capacitance sensing method.

In the case where the touch sensing circuit 50 performs touch sensing in the self-capacitance sensing method, the touch sensing circuit 50 may perform touch sensing on the basis of the capacitance between each touch electrode and a touch object (e.g., a finger, a pen, etc.).

According to the self-capacitance sensing method, each of the plurality of touch electrodes may serve as both a driving touch electrode and a sensing touch electrode. The touch driving circuit 60 may drive all or some of the plurality of touch electrodes, and may sense all or some of the plurality of touch electrodes.

In the case where the touch sensing circuit 50 performs touch sensing in the mutual-capacitance sensing method, the touch sensing circuit 50 may perform touch sensing on the basis of the capacitance between touch electrodes.

According to the mutual-capacitance sensing method, the plurality of touch electrodes are divided into driving touch electrodes and sensing touch electrodes. The touch driving circuit 60 may drive the driving touch electrodes and sense the sensing touch electrodes.

The touch driving circuit 60 and the touch controller 70 included in the touch sensing circuit 50 may be implemented as separate devices or may be implemented as a single device.

Further, the touch driving circuit 60 and the data driving circuit 20 may be implemented as separate devices or may be implemented as a single device.

Figure 2:
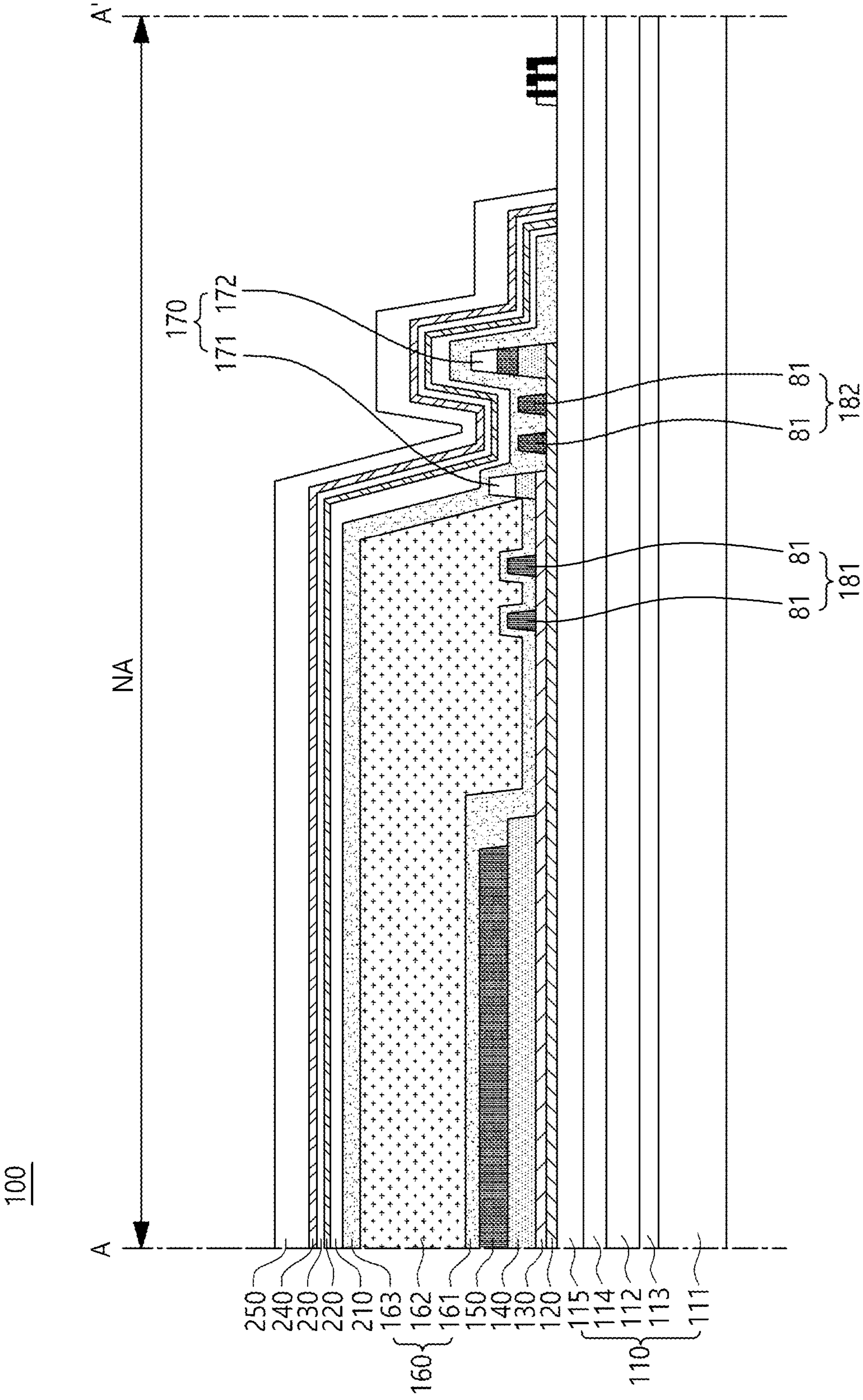
FIG. 2 is a partial cross-sectional view of the display apparatus shown in FIG. 1, taken along line A-A'.

FIG. 2 is a partial cross-sectional view of the display apparatus shown in FIG. 1, taken along line A-A'.

Referring to FIG. 2, the display apparatus 100 (particularly, the display panel 10) may include a base substrate 110, a metal layer 120, an electrode 130, a planarization layer 140, a bank 150, an encapsulation layer 160, a dam structure 170 and a control structure 180.

The base substrate 110 is to support various components of the display panel 10 of the display apparatus 100. Since the base substrate 110 has an area substantially identical to that of the display panel 10, it can be described that the base substrate 110 may also include the display area AA which displays an image by the plurality of subpixels SP and the non-display area NA which surrounds the display area AA.

For example, the base substrate 110 may be formed of an insulating material such as a glass substrate or a plastic substrate, and may be composed of a plurality of layers. For example, the base substrate 110 may include a first base substrate 111, a second base substrate 112, an interlayer insulating layer 113, a buffer layer 114, and an insulating layer 115.

The first base substrate 111 and the second base substrate 112 may be made of polyimide. Polyimide (PI) is a polymer with a relatively low degree of crystallinity or a mostly amorphous structure. Polyimide not only provides advantages that it is easy to be synthesized to make a thin film and does not require a cross-linker for curing, but also has high transparency, excellent heat and chemical resistance due to its rigid chain structure, excellent mechanical and electrical properties and dimensional stability.

However, polyimide has the disadvantage of poor moisture permeability resistance. Therefore, the interlayer insulating layer 113 which is made of an inorganic insulating material such as silicon nitride (SiNx) and silicon oxide (SiOx) may be defined between the first base substrate 111 and the second base substrate 112.

The buffer layer 114 may be disposed on the second base substrate 112, and may block moisture and oxygen from flowing into the second base substrate 112.

The insulating layer 115 may be disposed on the buffer layer 114, and may electrically insulate and protect the metal layer 120 located thereon.

The metal layer 120 may be formed in the display area AA and a part of the non-display area NA of the base substrate 110. For example, the metal layer 120 may be formed of the same material as a source electrode SE and a drain electrode DE of a driving transistor DTR, as shown in FIG. 3.

Figure 3:
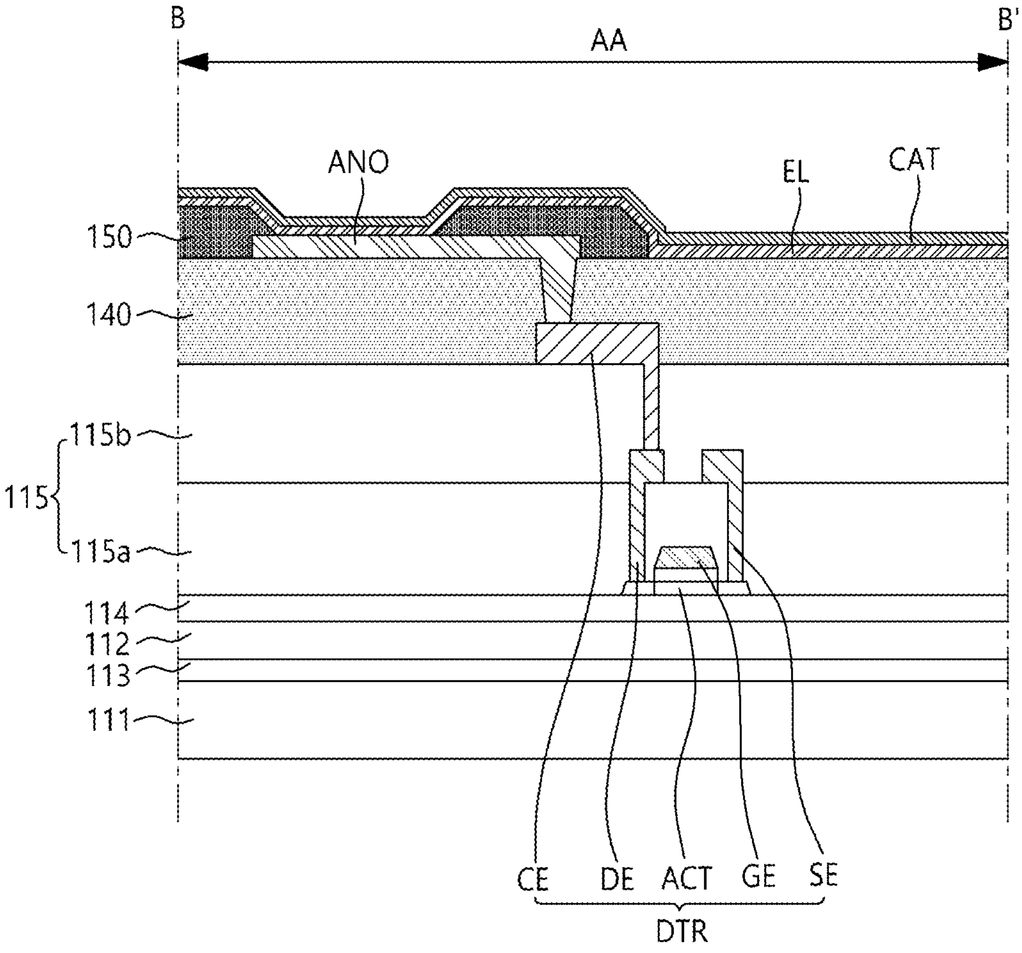
FIG. 3 is a partial cross-sectional view of the display apparatus shown in FIG. 1, taken along line B-B'.

FIG. 3 is a partial cross-sectional view of the display apparatus shown in FIG. 1, taken along line B-B'. Referring to FIG. 3, a driving transistor DTR (as a thin film transistor) and a light emitting element provided in the display area AA of the base substrate 110 will be described below.

Referring to FIG. 3, the base substrate 110 may include, in or on the insulating layer 115, the driving transistor DTR a part of which is formed with the same material as the metal layer 120. The insulating layer 115 may be composed of a single layer in the case of which the driving transistor DTR is disposed on the insulating layer 115, or a multilayer in the case of which the insulating layer 115 may include a first insulating layer **115*a* and a second insulating layer 115*b* and the driving transistor DTR is disposed in the insulating layer 115**.

The driving transistor DTR may include an active layer ACT, a gate electrode GE, a source electrode SE and a drain electrode DE. Specifically, the light emitting element may be connected to the drain electrode DE through a connection electrode CE, and the source electrode SE and the drain electrode DE may be connected to the active layer ACT in which a channel is formed when driving the driving transistor DTR.

The light emitting element may include a first electrode ANO, a second electrode CAT, and an organic layer EL which is disposed between the first electrode ANO and the second electrode CAT. The first electrode ANO may be an anode, and the second electrode CAT may be a cathode.

The first electrode ANO may be connected to the drain electrode DE of the driving transistor DTR through the connection electrode CE which is provided between the first electrode ANO and the drain electrode DE. The bank 150 is defined between adjacent first electrodes ANO of adjacent light emitting elements, and due to this fact, the adjacent first electrodes ANO may be electrically insulated from each other.

The organic layer EL may be defined on the first electrode ANO. The organic layer EL may include a hole transporting layer, an organic light emitting layer, an electron transporting layer, etc.

The second electrode CAT may be defined on the organic layer EL. When voltages are applied to the first electrode ANO and the second electrode CAT, holes and electrons may move to the organic light emitting layer through the hole transporting layer and the electron transporting layer, respectively, and may combine with each other in the organic light emitting layer to emit light.

The electrode 130 may be disposed on the metal layer 120, and is formed to be smaller than the metal layer 120 to expose a portion of the outer part of the metal layer 120 which is disposed in the non-display area NA. For example, the electrode 130 may be a power wiring to which a low potential voltage VSS is applied.

The planarization layer 140 is to alleviate height differences between structures located thereunder, and may be disposed on the electrode 130. For example, the planarization layer 140 may be formed of an organic material such as acryl resin, epoxy resin, phenolic resin, polyamide resin and polyimide resin.

The bank 150 is to partition subpixels, and may be disposed on the planarization layer 140. Although not shown, an opening which exposes the first electrode ANO located under the bank 150 may be formed in the bank 150 disposed in the display area AA.

The encapsulation layer 160 is to protect the electrode 130 located therebelow from external moisture, oxygen, shock, etc., and may seal the top and side of the electrode 130. For example, the encapsulation layer 160 may be provided in the display area AA and the non-display area NA, and may include a first encapsulation layer 161, a second encapsulation layer 162 and a third encapsulation layer 163.

The first encapsulation layer 161 may be formed of an inorganic material, and may cover the metal layer 120, the electrode 130 and the planarization layer 140. For example, the first encapsulation layer 161 may be formed of an inorganic insulating material capable of low temperature deposition, such as silicon nitride (SiNx), silicon oxide (SiOx), silicon oxynitride (SiON) and aluminum oxide ($Al_2O_3$). In this way, when the first encapsulation layer 161 is deposited under a low-temperature atmosphere, the first encapsulation layer 161 may prevent the light emitting layer which includes an organic material vulnerable to a high temperature atmosphere, from being damaged during a deposition process.

The second encapsulation layer 162 may be formed of an organic material, and may be formed on the first encapsulation layer 161. For example, the second encapsulation layer 162 may be formed of an organic insulating material such as acrylic resin, epoxy resin, polyimide, polyethylene and silicon oxycarbon (SiOC). In this way, as the second encapsulation layer 162 is formed of an organic material, it is possible to seal the elements disposed thereunder and at the same time alleviate height differences.

The second encapsulation layer 162 may be formed using an inkjet method. In this case, because the organic material forming the second encapsulation layer 162 may be injected in a liquid form and invade a driving circuit disposed on the outer part of the non-display area NA, a dam structure 170 may be formed in the non-display area NA. The second encapsulation layer 162 may seal up to the inside of the dam structure 170, particularly, the inside of a first dam 171 thereof. A detailed description of the dam structure 170 will be made later.

The third encapsulation layer 163 may be formed of an inorganic material, and may cover and seal the second encapsulation layer 162 and the dam structure 170 which is exposed outside the second encapsulation layer 162. For example, the third encapsulation layer 163 may be formed of an inorganic insulating material such as silicon nitride (SiNx), silicon oxide (SiOx), silicon oxynitride (SiON) and aluminum oxide (Al2O3).

In this way, as the encapsulation layer 160 is composed of a plurality of layers, it is possible to effectively protect the electrode 130 by minimizing penetration of moisture or oxygen from the outside.

The dam structure 170 is to restrain the end of the second encapsulation layer 162 made of an organic material in the encapsulation layer 160 and thereby prevent the second encapsulation layer 162 from flowing down or collapsing, and may be formed to be disposed in the non-display area NA and surround the second encapsulation layer 162. That is to say, when forming the second encapsulation layer 162 through the inkjet method, the organic material which is the material of the second encapsulation layer 162 is injected in a liquid form. Therefore, by defining the dam structure 170 at an area where the end of the second encapsulation layer 162 is formed, it is possible to prevent the organic material from invading the non-display area NA.

The dam structure 170 may include a first dam 171 which surrounds the perimeter of the second encapsulation layer 162, and at least one second dam 172 which is disposed to be spaced apart outward from the first dam 171 and is formed to have a height larger than the height of the first dam 171. For example, the first dam 171 may have a closed loop shape which is disposed in the non-display area NA and surrounds the second encapsulation layer 162. The second dam 172 may be formed in a closed loop shape which surrounds the first dam 171 in the non-display area NA. For example, the first dam 171 and the second dam 172 may be formed to surround and close the four sides of the display area AA on the non-display area NA. While it is shown in the present embodiment that the dam structure 170 includes two dams, a third dam may be further provided outside the second dam 172. According to another embodiment, the dam structure 170 may include only one dam, e.g., the first dam 171.

The dam of the dam structure 170 may include at least one layer or a plurality of layers. Specifically, the dam of the dam structure 170 may include at least one of the planarization layer 140, the bank 150 and a spacer.

For example, the first dam 171 may be formed of the same material as the bank 150, and the second dam 172 may include the same material as the planarization layer 140 and the bank 150. Alternatively, the first dam 171 may be formed of the same material as the planarization layer 140. In this case, since an additional mask process for forming the dam 170 may be omitted, the manufacturing cost may be reduced.

The control structure 180 may be disposed to be spaced apart toward the display area AA from the dam structure 170 and surround at least a part of the display area AA, and may be formed to protrude on or be recessed into at least one of the electrode 130 and the metal layer 120. For example, the metal layer 120 may be made of the same material as at least one of the source electrode SE and the drain electrode DE of the driving transistor DTR.

The control structure 180 may include at least one first control part 181 which is disposed inside the first dam 171 and a second control part 182 which is disposed between the first dam 171 and the second dam 172.

The first and second control parts 181, 182 may be disposed inside and outside the first dam 171 in the non-display area NA, respectively, and may be formed in a closed loop shape which surrounds the display area AA. It is described in the present embodiment that the first control part 181 is disposed inside the first dam 171 and the second control part 182 is disposed between the first dam 171 and the second dam 172, but an additional control part may also be further disposed outside the second dam 172.

In this way, as the control structure 180 is disposed in the non-display area NA, when injecting the organic material using the inkjet device, the organic material does not flow toward the dam structure 170 at once, and thus, it is possible to form the second encapsulation layer 162 into a desired shape. In other words, the control structure 180 controls the flow speed of the organic material when applying the organic material using the inkjet device.

For example, the control structure 180 may be formed of the same material as the bank 150. In this way, when the control structure 180 is formed of the same material as the bank 150, since the bank 150 and the control structure 180 may be formed using one mask, the manufacturing cost and time may be reduced.

The display apparatus 100 according to the embodiment of the present disclosure may further provide a touch sensing function in addition to an image display function. To this end, a touch buffer layer 210, a touch bridge 220, a touch insulating layer 230, a touch sensor 240 and an overcoat layer 250 may be sequentially included on the encapsulation layer 160.

Figure 4:
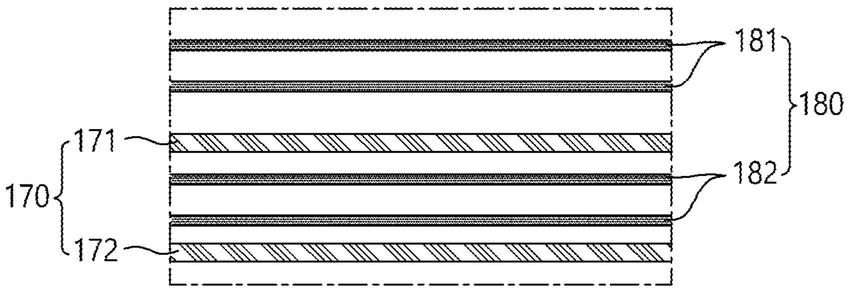
FIG. 4 is a plan view schematically showing a control structure according to the embodiment of the present disclosure.

FIG. 4 is a plan view schematically showing the control structure according to the embodiment of the present disclosure. FIG. 4 is a diagram showing an area "C" of FIG. 1.

Referring to FIGS. 1 to 4, the control structure 180 may be formed in parallel with the dam structure 170 on the same side of the display area. That is to say, when the dam structure 170 is disposed in a horizontal direction in the drawing, the control structure 180 may also be disposed in parallel with the dam structure 170 on the same side of the display area in the horizontal direction.

The first and second control parts 181, 182 each may be provided as a plurality of protruding structures 81 which protrude upward on at least one of the electrode 130 and the metal layer 120 to surround the display area AA. The plurality of protruding structures 81 may be formed to have a height smaller than the height of the first dam 171. This is because when the plurality of protruding structures 81 are formed to have a height larger than the height of the first dam 171, the liquid organic material which forms the second encapsulation layer 162 during the inkjet process cannot flow over the plurality of protruding structures 81 and thus cannot be formed up to the first dam 171.

The second control part 182 is auxiliary means which is formed in preparation for a case where the organic material flows over the first dam 171 when forming the second encapsulation layer 162 to be disposed up to the second dam 172. It should be noted that when there is only the first dam 171, only the first control part 181 may be provided.

For example, the first control part 181 may be formed as at least one protruding structure 81 or a plurality of protruding structures 81 which are disposed to be spaced apart from each other between the display area AA and the first dam 171. As such, when the first control part 181 is formed as a plurality of protruding structures 81, the second encapsulation layer 162 may be disposed in the space between the plurality of protruding structures 81. In other words, during the inkjet process, since the liquid organic material which forms the second encapsulation layer 162 is cured while flowing over the tops of the plurality of protruding structures 81, the second encapsulation layer 162 after curing may be disposed in the space between the plurality of protruding structures 81.

The second control part 182 may be formed as a plurality of protruding structures 81 which are disposed to be spaced apart from each other between the display area AA and the second dam 172. The third encapsulation layer 163 may be disposed in the space between the plurality of protruding structures 81 of the second control part 182. Where the organic material flows over the first dam 171 when forming the second encapsulation layer 162, the organic material may also be disposed in the space between the plurality of protruding structures 81 of the second control part 182.

As in the present embodiment, as each of the first and second control parts 181, 182 is formed as the plurality of protruding structures 81 which are disposed in parallel with the first and second dams 171, 172 on the same side of the display area, during the inkjet process for the organic material for forming the second encapsulation layer 162, the organic material generally does not flow toward the first dam 171 at once, and the flow may be partially blocked by the plurality of protruding structures 81 of the first control part 181. Even if the organic material flows over the first dam 171, it will not flow toward the second dam 172 at once, and the flow may be partially blocked by the plurality of protruding structure 81 of the second control part 182. Therefore, since the flow speed of the organic material may be slowed, compared to a case without the control structure 180, the liquid organic material may be controlled more easily, and thus, the second encapsulation layer 162 may be disposed in a desired shape up to a desired location.

In addition, since the flow of the organic material is controlled, when injecting the organic material through the inkjet device, it is possible to effectively prevent the organic material from overflowing out of the dam structure 170. Thus, it is possible to solve the problem that the organic material invades a drive circuit located outside the dam structure 170 to cause a driving failure.

Figure 5:
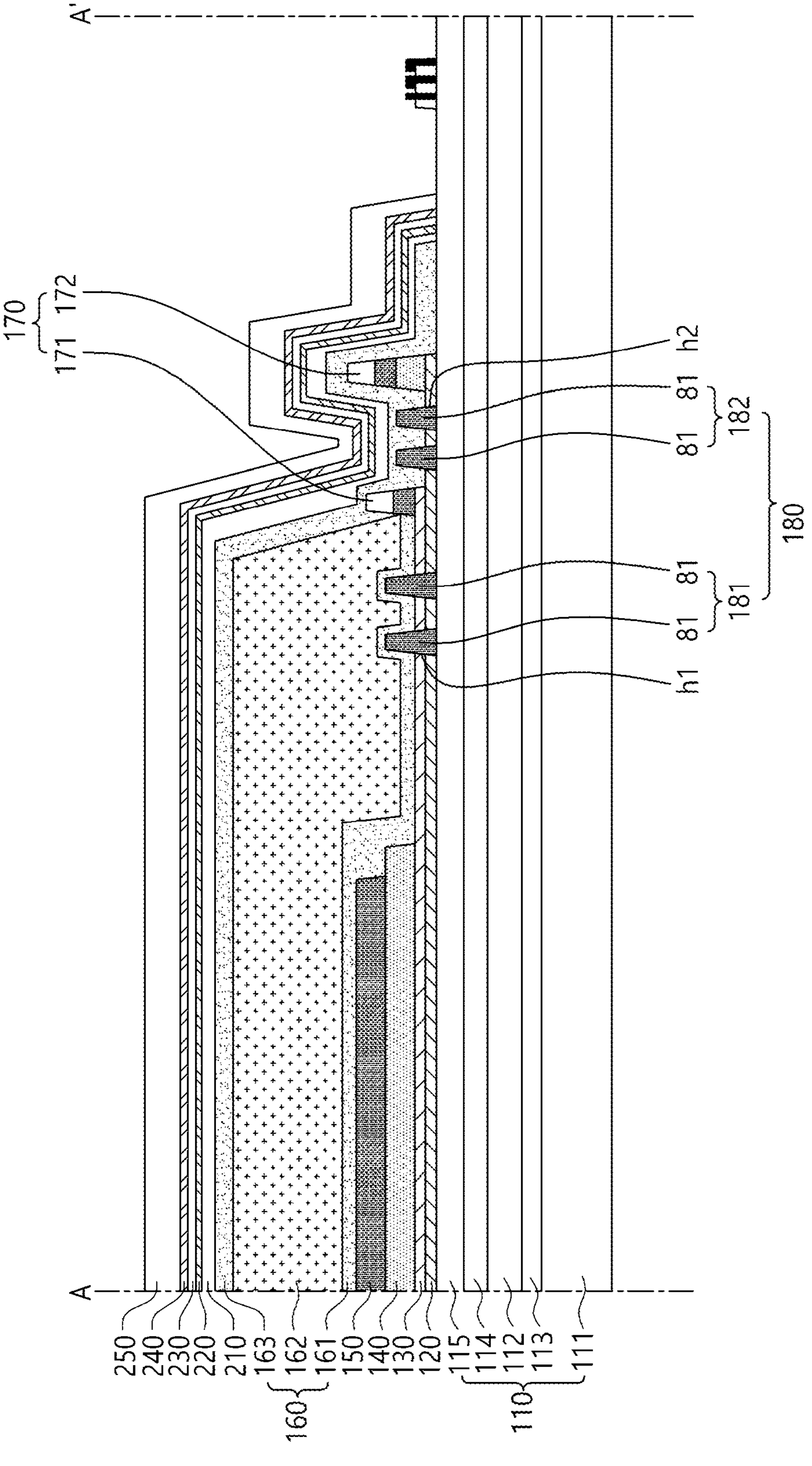
FIGS. 5 and 6 are partial cross-sectional views of display apparatuses according to other embodiments of the present disclosure.

FIG. 5 is a partial cross-sectional view of a display apparatus according to another embodiment of the present disclosure. In the present embodiment, description will be made mainly on differences from the embodiment described above.

Referring to FIG. 5, the first and second control parts 181, 182 may be provided as a plurality of protruding structures 81 which pass through at least one of the metal layer 120 and the electrode 130 on the base substrate 110. Namely, when compared to the control structure 180 of FIG. 2, one or more of the electrode 130 and the metal layer 120 are formed with first and second through holes h1 and h2 at areas which face the plurality of protruding structures 81, respectively, and the plurality of protruding structures 81 may be additionally disposed in the first and second through holes h1 and h2. The plurality of protruding structures 81 in the present embodiment may be additionally disposed in the metal layer 120 and the electrode 130.

For example, the first through holes h1 which open in a vertical direction may be formed in the metal layer 120 and the electrode 130 located between the display area AA and the first dam 171, and lower portions of the plurality of protruding structures 81 constituting the first control part 181 may be disposed in the first through holes h1. The second through holes h2 are formed in the metal layer 120 located between the first dam 171 and the second dam 172, and the lower portions of the plurality of protruding structures 81 constituting the second control part 182 may be disposed in the second through holes h2.

In the present embodiment, compared to the embodiment shown in FIG. 2, the plurality of protruding structures 81 may be formed to have a larger height. Therefore, during the inkjet process, the plurality of protruding structures 81 may support more stably the organic material to effectively control the flow thereof.

Figure 6:
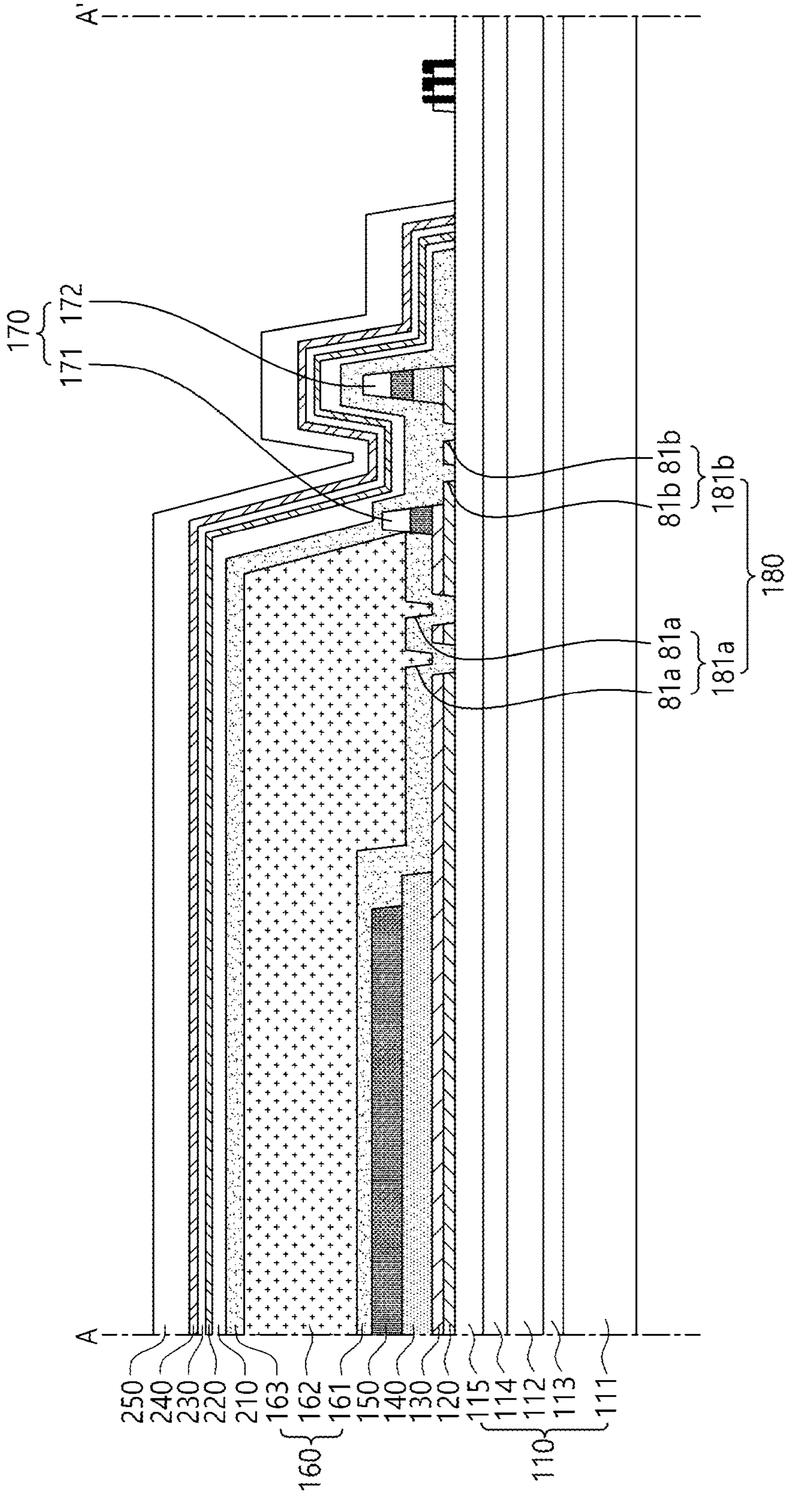

FIG. 6 is a partial cross-sectional view of a display apparatus according to another embodiment of the present disclosure. In the present embodiment, description of the same configuration overlapping the configuration of the previously described embodiment will be omitted, and description will be made mainly on differences.

Referring to FIG. 6, the first and second control parts 181, 182 may be provided as first and second trenches 81*a* and 81*b*, respectively, which are formed in groove or hole shapes as at least one of the electrode 130 and the metal layer 120 is recessed and surround the display area AA. By forming the first and second trenches 81*a* and 81*b* of engraved shapes in the at least one of the metal layer 120 and the electrode 130, when applying the organic material using the inkjet device, portions of the organic material may flow into the first and second trenches 81*a* and 81*b*, and thus, the flow speed of the organic material may decrease when the organic material passes over the first and second trenches 81*a* and 81*b*.

For example, the first and second trenches 81*a* and 81*b* each may be provided as more than one, and the first trenches 81*a* may be disposed to be spaced apart from each other between the display area AA and the first dam 171, and the second trenches 81*b* may be disposed to be spaced apart from each other between the first dam 171 and the second dam 172. For example, a plurality of first trenches 81*a* may be disposed in the metal layer 120 and the electrode 130 located between the display area AA and the first dam 171 to be spaced apart from each other, and a plurality of second trenches 81*b* may be disposed in the metal layer 120 located between the first dam 171 and the second dam 172 to be spaced apart from each other. The second trenches 81*b* are auxiliary means which are formed in preparation for a case where the organic material flows over the first dam 171 when forming the second encapsulation layer 162 to be disposed up to the second dam 172. According to another embodiment, the first and second trenches 81*a* and 81*b* each may be provided as one.

As such, in the case where the control structure 180 is formed as recessed trench structures, the second encapsulation layer 162 may be disposed in the plurality of first trenches 81*a* of a first control part 181*a*, and the third encapsulation layer 163 may be disposed in the plurality of second trenches 81*b* of a second control part 181*b*.

As the first and second trenches 81*a* and 81*b* are formed to have a larger depth, the amount of the organic material flowing into the first and second trenches 81*a* and 81*b* may increase. When the first and second trenches 81*a* and 81*b* are formed in hole shapes with no residual layer at the bottoms thereof, the amount of the organic material flowing into the first and second trenches 81*a* and 81*b* may be maximized to most efficiently reduce the flow speed of the organic material. However, when forming the first and second trenches 81*a* and 81*b* in hole shapes, underlying components may be damaged during processing. Therefore, the first and second trenches 81*a* and 81*b* may be formed in groove shapes so that a residual layer of a thinnest possible thickness may be left at the bottoms of the first and second trenches 81*a* and 81*b*.

As in the present embodiment, as the control structure 180 is formed as the first and second trenches 81*a* and 81*b* which are disposed in parallel with the dam structure 170 on the same side of the display area, during the inkjet process for the organic material for forming the second encapsulation layer 162, the organic material does not flow toward the dam structure 170 at once, and the flow speed of the organic material may be reduced as the organic material flows into the first and second trenches 81*a* and 81*b*. Therefore, compared to a case without the first and second trenches 81*a* and 81*b*, the liquid organic material may be more easily controlled to form the second encapsulation layer 162 into a desired shape.

A display apparatus 100 according to an embodiment of the present disclosure may include a plurality of guide portions 190 which guide the flow of the organic material so that the organic material may be evenly spread toward the dam structure 170 when applying the organic material as the material of the second encapsulation layer 162.

Figure 7:
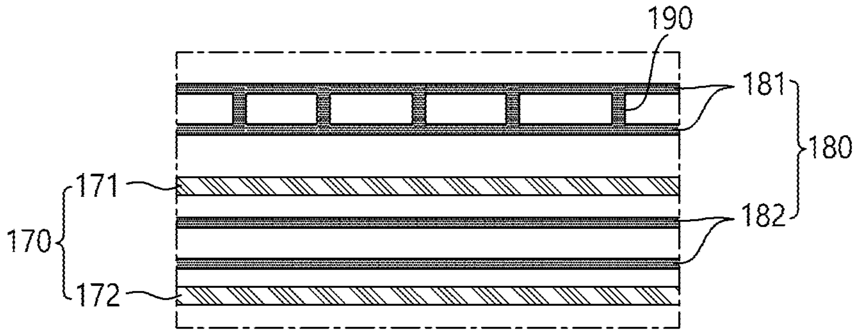
FIG. 7 is a plan view schematically showing guide portions according to an embodiment of the present disclosure.

FIG. 7 is a plan view schematically showing a plurality of guide portions according to an embodiment of the present disclosure. FIG. 7 is a diagram showing an area "C" of FIG. 1.

Referring to FIG. 7, the plurality of guide portions 190 may be disposed close to the first control part 181 in a direction perpendicular to the first control part 181, and may be formed by being recessed into the at least one of the electrode 130 and the metal layer 120.

For example, the first control part 181 may be disposed in parallel with the first dam 171 on the same side of the display area, and a plurality of first control sub-parts of the first control part 181 may be provided to be spaced apart from each other in the non-display area NA. The plurality of guide portions 190 may be disposed in a direction perpendicular to the first control part 181, and may be formed so that at least a part of the guide portion is between the plurality of first control sub-parts. Particularly, both ends of the guide portion do not protrude out of the first control part 181.

That is to say, the first dam 171 and the first control part 181 may be disposed in a horizontal direction in the drawing, and the plurality of guide portions 190 may be disposed in a vertical direction in the drawing. For example, the plurality of guide portions 190 may be disposed between a pair of first control sub-parts to be spaced apart from each other, and may be formed so that both ends thereof do not protrude out of the first control part 181.

In this way, as the plurality of guide portions 190 which guide the flow of the liquid organic material are provided, when applying the organic material for forming the second encapsulation layer 162, the organic material may flow in a direction along the plurality of guide portions 190. Due to this fact, since the flow of the organic material with fluidity may be more easily controlled, the end of the second encapsulation layer 162 may be formed at a desired location after curing. For example, it is possible to cause the end of the second encapsulation layer 162 to spread evenly up to the first dam 171.

Figure 8:
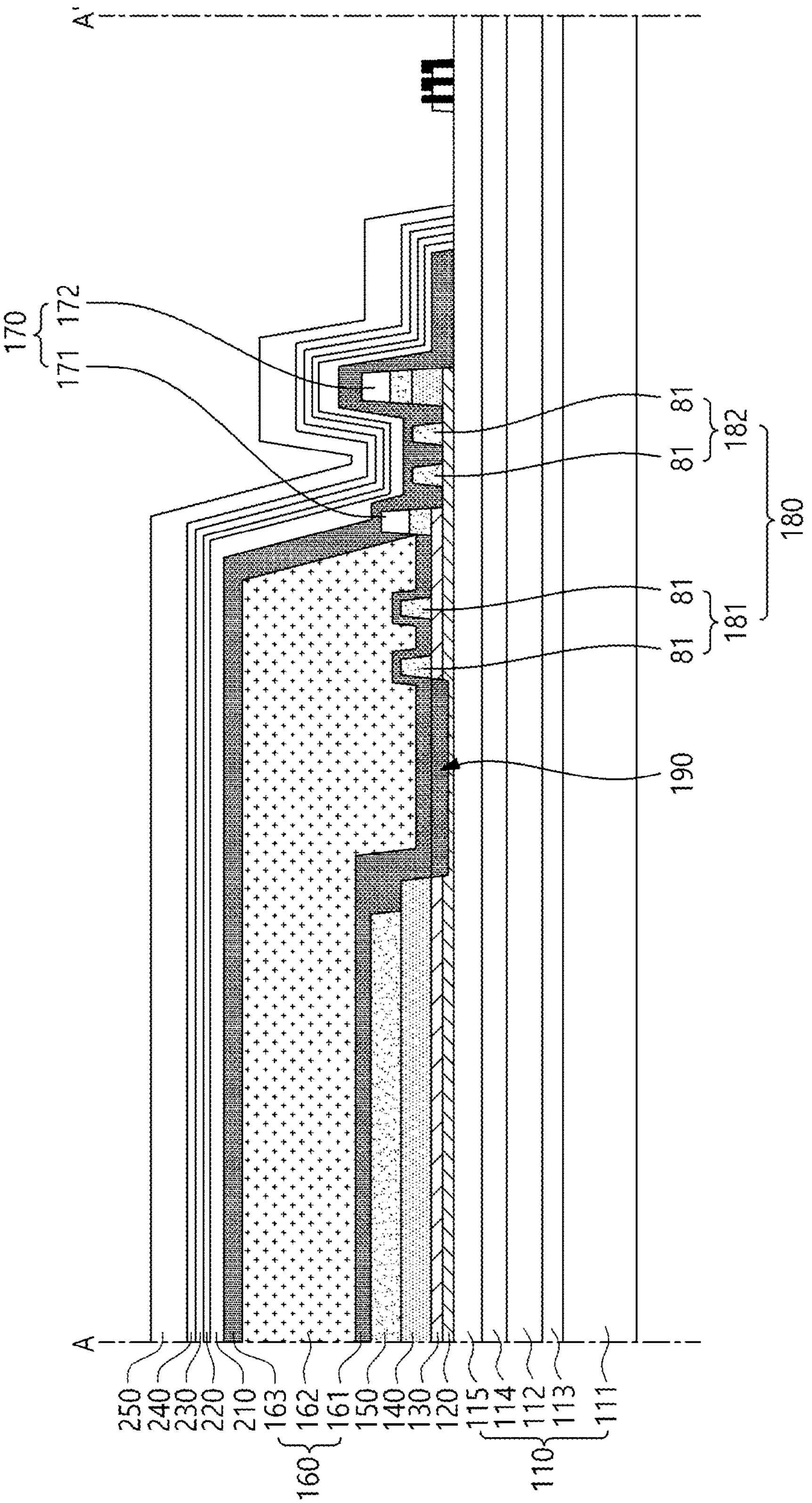
FIG. 8 is a partial cross-sectional view of a display apparatus in which the guide portions of FIG. 7 are formed.

FIG. 8 is a partial cross-sectional view of a display apparatus in which the guide portions of FIG. 7 are formed. In the present embodiment, description of the same configuration overlapping the configuration of the previously described embodiment will be omitted, and description will be made mainly on differences.

Referring to FIG. 8, the plurality of guide portions 190 may overlap the second encapsulation layer 162. For example, the guide portions 190 may not be disposed between the first dam 171 and the second dam 172.

Figure 9:
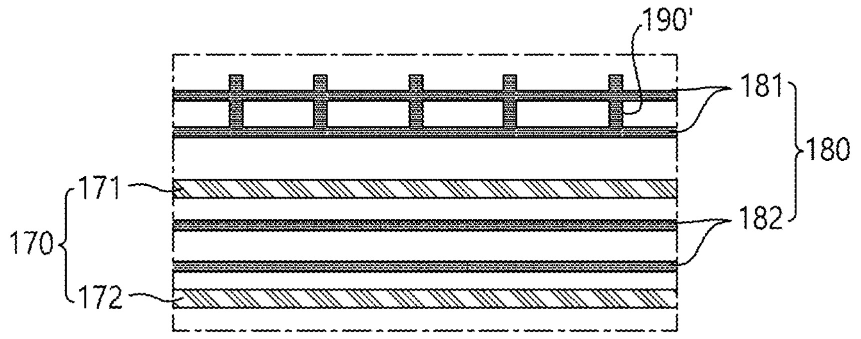
FIGS. 9 and 10 are plan views schematically showing guide portions according to other embodiments of the present disclosure.

FIG. 9 is a plan view schematically showing a plurality of guide portions according to another embodiment of the present disclosure.

Referring to FIG. 9, a plurality of guide portions 190' may be provided and be disposed between a pair of first control sub-parts of the first control part 181 to be spaced apart from each other. In the drawing, the guide portions 190' may be disposed between the pair of first control sub-parts in a direction perpendicular to the first control part 181. The ends of the guide portions 190' which are located closer to the display area AA than the first dam 171 in the non-display area NA may protrude outward of the first control part 181.

In this way, as the ends of the plurality of guide portions 190' protrude outward of the first control part 181, portions of the liquid organic material may flow into the plurality of guide portions 190' before the flow of the organic material is blocked by the first control part 181, whereby it is possible to achieve the effect that a processing time is shortened.

Figure 10:
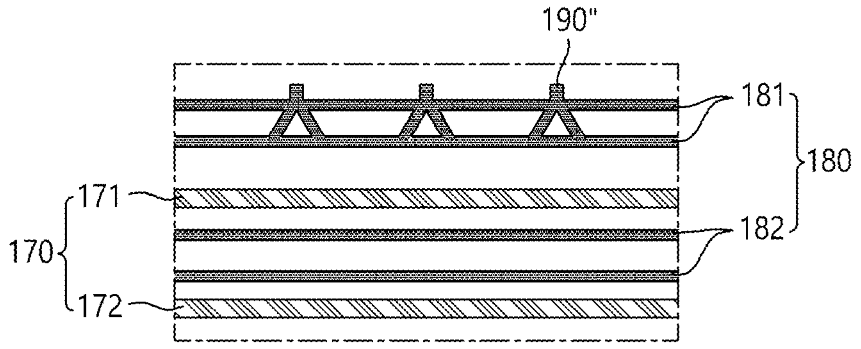

FIG. 10 is a plan view schematically showing guide portions according to another embodiment of the present disclosure.

Referring to FIG. 10, a plurality of guide portions 190" may be provided and be disposed between a pair of first control sub-parts in a direction perpendicular to the first control part 181, and the ends of the guide portions 190" which are located closer to the display area AA may protrude outward of the first control part 181. Here, parts of the plurality of guide portions 190" disposed between the pair of first control sub-parts may branch in two directions from the protruding ends, and be formed to diverge in a direction facing the first dam 171.

In other words, the plurality of guide portions 190" may be formed in a "Y" shape. In this way, as the plurality of guide portions 190" are formed in a "Y" shape, flowability may be enhanced so that a larger amount of the organic material may be evenly spread up to (the inside of) the first dam 171. Therefore, a processing time for forming the second encapsulation layer 162 may be shortened, and at the same time, the end of the second encapsulation layer 162 may be formed at a desired location.

A brief description of the embodiments of the present disclosure described above is as follows.

According to embodiments of the present disclosure, it is possible to provide a display apparatus including: a base substrate including a display area and a non-display area which surrounds the display area; a metal layer formed on the base substrate in the display area and a part of the non-display area; an electrode disposed on the metal layer; an encapsulation layer disposed on the electrode, sealing a top and a side of the electrode and comprising an organic layer; a first dam disposed on the base substrate in the non-display area, and surrounding a perimeter of the organic layer of the encapsulation layer; and a first control part disposed on the base substrate between the first dam and the display area and spaced apart from the first dam, surrounding at least a part of the display area, and formed to protrude on or be recessed into at least one of the electrode and the metal layer.

According to the embodiments of the present disclosure, the first control part may be formed in parallel with the first dam on the same side of the display area.

According to the embodiments of the present disclosure, when the first control part is recessed into the at least one of the electrode and the metal layer and formed in a recessed structure, the organic layer of the encapsulation layer may be disposed in a recessed portion of the first control part.

According to the embodiments of the present disclosure, when the first control part protrudes on the at least one of the electrode and the metal layer and is formed as a plurality of protruding structures, the organic layer of the encapsulation layer may be disposed in a space between the plurality of protruding structures.

According to the embodiments of the present disclosure, when the first control part protrudes on the at least one of the electrode and the metal layer, the first control part may be provided as a protruding structure which protrudes on the at least one of the electrode and the metal layer to surround the display area.

According to the embodiments of the present disclosure, the at least one of the electrode and the metal layer may be formed with a through hole in an area which faces the protruding structure, and the protruding structure may be additionally disposed in the through hole.

According to the embodiments of the present disclosure, the protruding structure may be formed to have a height smaller than a height of the first dam.

According to the embodiments of the present disclosure, a plurality of protruding structures may be provided, and may be disposed to be spaced apart from each other between the display area and the first dam.

According to the embodiments of the present disclosure, as the first control part is recessed into the at least one of the electrode and the metal layer, and the at least one of the electrode and the metal layer is formed with a recessed groove or a hole, the first control part may be provided as a trench which surrounds at least a part of the display area.

According to the embodiments of the present disclosure, a plurality of trenches may be provided, and may be disposed to be spaced apart from each other between the display area and the first dam.

According to the embodiments of the present disclosure, the display apparatus may further include a planarization layer disposed on the electrode, and a bank disposed on the planarization layer, and the first control part may be formed of the same material as the bank.

According to the embodiments of the present disclosure, the metal layer may include the same material as at least one of a source electrode and a drain electrode of a thin film transistor disposed on the base substrate.

According to the embodiments of the present disclosure, a plurality of guide portions may be disposed close to the first control part in a direction perpendicular to the first control part, and may be formed by being recessed into the at least one of the electrode and the metal layer.

According to the embodiments of the present disclosure, the first control part may be disposed in parallel with the first dam on the same side of the display area, and may include a plurality of first control sub-parts which are disposed to be spaced apart from each other in the non-display area; and a plurality of guide portions may be disposed in a direction perpendicular to the first control part, and may be formed so that at least a part of the guide portion is between the plurality of first control sub-parts.

According to the embodiments of the present disclosure, both ends thereof do not protrude out of the first control part.

According to the embodiments of the present disclosure, an end of the guide portion which is located closer to the display area may protrude outward of the first control part.

According to the embodiments of the present disclosure, a part of the guide portion disposed between the plurality of first control sub-parts may branch in two directions from the protruding end, and may be formed to diverge in a direction facing the first dam.

According to the embodiments of the present disclosure, the display apparatus may further comprise: a second dam which is disposed on the base substrate in the non-display area to be spaced apart outwardly from the first dam and is formed to have a height larger than a height of the first dam, and a second control part which is disposed between the first dam and the second dam.

According to the embodiments of the present disclosure, the display apparatus may further comprise: a planarization layer disposed on the electrode, and a bank disposed on the planarization layer, wherein the second control part has the same material as the bank.

According to the embodiments of the present disclosure, the second control part may be formed in parallel with the second dam on the same side of the display area.

According to the embodiments of the present disclosure, the second control part may be formed as a protruding structure which protrudes on the metal layer.

According to the embodiments of the present disclosure, the metal layer may be formed with a through hole in an area which faces the protruding structure, and the protruding structure may be additionally disposed in the through hole.

According to the embodiments of the present disclosure, the protruding structure may be formed to have a height smaller than a height of the first dam.

According to the embodiments of the present disclosure, a plurality of protruding structures may be provided, and may be disposed to be spaced apart from each other between the first dam and the second dam.

According to the embodiments of the present disclosure, the metal layer may be formed with a recessed groove or a hole, and the second control part may be provided as a trench which surrounds at least a part of the display area.

According to the embodiments of the present disclosure, a plurality of trenches may be provided, and may be disposed to be spaced apart from each other between the first dam and the second dam.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
- a base substrate including a display area and a non-display area adjacent to the display area;
- a metal layer on the base substrate, the metal layer on the display area and a part of the non-display area;
- an electrode disposed on the metal layer;
- an encapsulation layer disposed on the electrode, sealing a top and a side of the electrode, the encapsulation layer comprising an organic layer;
- a first dam disposed on the base substrate in the non-display area, and surrounding a perimeter of the organic layer of the encapsulation layer; and
- a first control part disposed on the base substrate between the first dam and the display area and spaced apart from the first dam, surrounding at least a part of the display area,
- wherein the first control part protrudes on or is recessed into at least one of the electrode and the metal layer.

2. The display apparatus of claim 1, wherein the first control part is formed in parallel with the first dam on the same side of the display area.

3. The display apparatus of claim 1, wherein when the first control part is recessed into the at least one of the electrode and the metal layer and formed in a recessed structure, the organic layer of the encapsulation layer is disposed in a recessed portion of the first control part.

4. The display apparatus of claim 1, wherein when the first control part protrudes on the at least one of the electrode and the metal layer and is formed as a plurality of protruding structures, the organic layer of the encapsulation layer is disposed in a space between the plurality of protruding structures.

5. The display apparatus of claim 1, wherein when the first control part protrudes on the at least one of the electrode and the metal layer, the first control part is provided as a protruding structure which protrudes on the at least one of the electrode and the metal layer to surround the display area.

6. The display apparatus of claim 5, wherein the at least one of the electrode and the metal layer is formed with a through hole in an area which faces the protruding structure, and the protruding structure is additionally disposed in the through hole.

7. The display apparatus of claim 5, wherein the protruding structure is formed to have a height smaller than a height of the first dam.

8. The display apparatus of claim 5, further comprising a plurality of protruding structures, the plurality of protruding structures disposed to be spaced apart from each other between the display area and the first dam.

9. The display apparatus of claim 1, wherein as the first control part is recessed into the at least one of the electrode and the metal layer, and the at least one of the electrode and the metal layer is formed with a recessed groove or a hole, the first control part is provided as a trench which surrounds at least a part of the display area.

10. The display apparatus of claim 9, further comprising a plurality of trenches, the plurality of trenches disposed to be spaced apart from each other between the display area and the first dam.

11. The display apparatus of claim 1, further comprising:
- a planarization layer disposed on the electrode, and a bank disposed on the planarization layer,
- wherein the first control part includes a same material as the bank.

12. The display apparatus of claim 1, wherein the metal layer includes a same material as at least one of a source electrode and a drain electrode of a thin film transistor disposed on the base substrate.

13. The display apparatus of claim 1, further comprising a plurality of guide portions disposed close to the first control part in a direction perpendicular to the first control part, and are formed by being recessed into the at least one of the electrode and the metal layer.

14. The display apparatus of claim 1, further comprising a plurality of guide portions,
- wherein the first control part is disposed in parallel with the first dam on the same side of the display area, and includes a plurality of first control sub-parts which are disposed to be spaced apart from each other in the non-display area, and
- wherein the plurality of guide portions is disposed in a direction perpendicular to the first control part, and are formed so that at least a part of the guide portion is between the plurality of first control sub-parts.

15. The display apparatus of claim 14, wherein both ends of the guide portion do not protrude out of the first control part.

16. The display apparatus of claim 14, wherein an end of the guide portion which is located closer to the display area protrudes outward of the first control part.

17. The display apparatus of claim 14, wherein a part of the guide portion disposed between the plurality of first control sub-parts branches in two directions from the protruding end, and is formed to diverge in a direction facing the first dam.

18. The display apparatus of claim 1, further comprising:

a second dam which is disposed on the base substrate in the non-display area to be spaced apart outwardly from the first dam and is formed to have a height larger than a height of the first dam, and a second control part which is disposed between the first dam and the second dam.

19. The display apparatus of claim 18, further comprising:

a planarization layer disposed on the electrode, and a bank disposed on the planarization layer, wherein the second control part has a same material as the bank.

20. The display apparatus of claim 19, wherein the second control part is formed in parallel with the second dam on a same side of the display area.

21. The display apparatus of claim 19, wherein the second control part is formed as a protruding structure which protrudes on the metal layer.

22. The display apparatus of claim 21, wherein the metal layer is formed with a through hole in an area which faces the protruding structure, and the protruding structure is additionally disposed in the through hole.

23. The display apparatus of claim 21, wherein the protruding structure is formed to have a height smaller than a height of the first dam.

24. The display apparatus of claim 21, wherein a plurality of protruding structures are provided, and are disposed to be spaced apart from each other between the first dam and the second dam.

25. The display apparatus of claim 19, wherein the metal layer is formed with a recessed groove or a hole, and the second control part is provided as a trench which surrounds at least a part of the display area.

26. The display apparatus of claim 25, wherein a plurality of trenches is provided, and are disposed to be spaced apart from each other between the first dam and the second dam.

* * * * *